United States Patent [19]

Shiga

[11] Patent Number: 4,791,386

[45] Date of Patent: Dec. 13, 1988

[54] DIGITAL PHASE-LOCKED LOOP WITH RANDOM WALK FILTER

[75] Inventor: Nobuo Shiga, Kanagawa, Japan

[73] Assignee: Sumitomo Electric Industries, Ltd., Osaka, Japan

[21] Appl. No.: 69,121

[22] Filed: Jul. 2, 1987

[30] Foreign Application Priority Data

Jul. 8, 1986 [JP] Japan ............................... 61-160368

[51] Int. Cl.⁴ ............................................. H03L 7/08
[52] U.S. Cl. ................................... 331/1 A; 331/17; 331/25; 328/155
[58] Field of Search .......................... 331/1 A, 17, 25; 307/511, 514, 516; 328/133, 134, 155

[56] References Cited

U.S. PATENT DOCUMENTS 4,574,243 3/1986 Levine .................................. 328/155
4,577,163 3/1986 Culp .................................... 331/1 A

*Primary Examiner*—Siegfried H. Grimm
*Attorney, Agent, or Firm*—Sughrue, Mion, Zinn, Macpeak, and Seas

[57] ABSTRACT

A digital phase-locked loop in which the lead or lag of the phase of the input is compared to the phase of the output of the loop and the occurrences of the advance or retardation are filtered in a random walk filter in order to phase control the output. According to the invention, the time trend of the advance or retardation is determined. If there is a significant run of either advance or retardation, the random walk filter is adjusted so as to more quickly provide correcting output.

7 Claims, 3 Drawing Sheets

DIGITAL PHASE-LOCKED LOOP WITH RANDOM WALK FILTER

BACKGROUND OF THE INVENTION

Field of the Invention

The present invention relates to a digital phase-locked loop. It particularly relates to a digital phase-locked loop in which a random walk filter is used to effectively suppress the jitter of an input signal.

BACKGROUND OF THE INVENTION

A conventional digital phase-locked loop has been used for many purposes such as signal retiming and signal selection (refer to "IEEE Transactions on Communications", vol. COM-20, No. 2, page 95, April, 1972: Title: Phase Noise and Transient times for a Binary Quantized Digital Phase-Locked Loop in White Gaussian Noise, written by JAMES R. CESSNA, DONALD M. LEVY). In the conventional digital phase-locked loop shown in FIG. 1, an input digital signal to the system and the output signal of a scaler 25 are supplied to a binary phase detector 21. The output of the binary phase detector 21 is a lead output or a lag output and is selectively supplied to a random walk filter 22. An advance input or a retard input is sent from the random walk filter 22 to a phase controller 14. An oscillator 23 supplies to the phase controller 24 a signal whose frequency is much higher than that of the input digital signal. The output of the phase controller 24 is frequency-divided by the scaler 25, the output of which is sent to the outside of the digital phase-locked loop as well as fed back to the binary phase detector 21.

As shown in FIG. 2, the major part of the random walk filter 22 is an up-down counter 22a having 2N stages. The count of the counter 22a is increased by one every time the lead input is supplied thereto. The count of the counter 22a is decreased by one every time the lag input is supplied thereto. The carry output of the updown counter 22a is used as the advance output. The borrow output of the counter 22a is used as the retard output. The output signal of an OR gate 22b, which receives both the outputs, is supplied to the resetting terminal of the up-down counter 22a to reset the count of the counter to N.

When the lead input has been supplied a number of times, which is N more than that of the supply of the lag input, the advance output is sent out from the up-down counter 22a for the phase controller 24 to delay the phase of the output of the stable fixed oscillator 23. Thereafter, the scaler 25 frequency divides the phase delayed signal to send out a signal compensated for the phase deviation.

When the lag input has been supplied a number of times N more than that for which the lead input has been supplied, the retard output is sent out from the up-down counter 22a to advance the phase of the output of the stable fixed oscillator 23 by the phase controller 24. The phase advanced output is frequency divided by the scaler 25 to send out a signal compensated for the phase deviation.

As understood from the above description, the control of the phase is not necessarily performed immediately after the supply of the lead input or the lag input but is performed only when the number of times of the supply of one of the lead input and the lag input has become N more than that of times of the supply of the other. As a result, the jitter of the input digital signal can be suppressed to stabilize the phase of the output signal.

In the above-described conventional digital phase-locked loop, the effect of the jitter suppression can be enhanced by increasing the number of the stages of the up-down counter 22a. However, if the number of the stages of the up-down counter 22a is increased, the response time of the digital phase-locked loop is lengthened in proportion to the increased number of the stages so that the effect of the jitter suppression and the transient characteristic of the loop conflict with each other. In other words, the transient characteristic is degraded if the effect of the jitter suppression is enhanced and the effect of the jitter suppression is degraded if the transient characteristic is enhanced.

SUMMARY OF THE INVENTION

The present invention was made in consideration of the above-described problem.

Accordingly it is an object of the present invention to provide a digital phase-locked loop whose jitter suppression effect and transient characteristic are both enhanced.

The digital phase-locked loop provided in accordance with the present invention includes a phase deviation trend detection means which receives a lead input and a lag input and sends out a phase deviation trend indication output. A reference value control means receives the phase deviation trend indication pulses from the phase deviation trend detection means and alters a reference value for a random walk filter depending on the trend of phase deviation.

DETAILED DESCRIPTION OF THE PREFERRED EMBODIMENTS

In the digital phase-locked loop provided in accordance with the present invention, the phase of an input signal is determined to supply either the lead input or the lag input. The lead or lag input is supplied to the random walk filter which supplies phase advance control pulses or phase delay control pulses to a phase controller which outputs a signal compensated for the phase deviation. At that time, the trend of the phase deviation is determined by the phase deviation trend detection means in terms of the lead input or the lag input so that the reference value supplied to the random walk filter is altered depending on the trend of the phase deviation. The reference value control means alters the reference value in terms of the phase deviation trend indication pulses sent out from the phase deviation trend detection means.

Since the phase deviation usually occurs in such a manner that the phase is only leading or only lagging, a sufficient effect of jitter suppression can be produced even if the reference value for the random walk filter is altered in a unidirectional manner at the time of the detection of the phase deviation so as to control the phase by a reduced number of times of supply of the input indication pulses.

An embodiment of the present invention is hereafter described in detail with reference to the drawings attached hereto.

Figure 3:
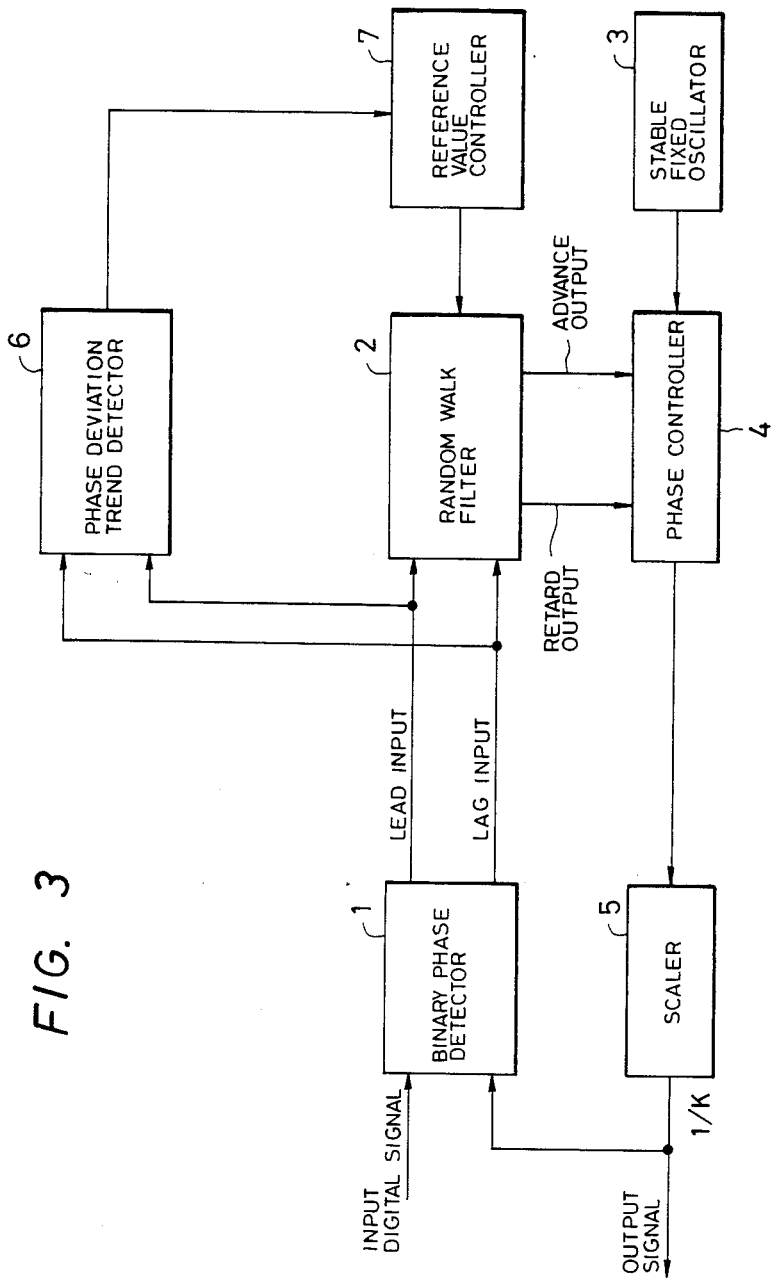
FIG. 3 shows a circuit diagram indicating the electrical design of a digital phase-locked loop provided in accordance with the present invention.

FIG. 3 shows a circuit diagram of a digital phase-locked looped which is an embodiment of the invention. The loop comprises a binary phase detector 1, a random walk filter 2, a fixed stable oscillator 3, a phase controller 4, a scaler 5, a phase deviation trend detector 6 and a reference value controller 7.

The binary phase detector 1 receives an input digital signal to the system and a frequency-divided signal from the scaler 5 and judges whether the phase of the input digital signal is advanced or retarded. The detector 1 then sends out a lead signal or a lag signal.

The random walk filter 2 is made of an up-down counter having 2N stages. The count of the counter is increased by one every time the lead signal is supplied thereto. The count of the counter is decreased by one every time the lag signal is supplied thereto. The filter 2 sends out a carry pulse as an advance output or a borrow pulse as a retard output.

The fixed stable oscillator 3 sends out a signal whose frequency is much higher than that of the input digital signal (for instance, the frequency of the signal of the oscillator 3 is 1.6 MHz when that of the input digital signal is 100 kHz).

The phase controller 4 regulates the frequency of the signal of the fixed oscillator 3 depending on the advance output or the retard output.

The scaler 5 frequency-divides the output signal of the phase controller 4 to a frequency of a value 1/k of the input frequency (k denotes a preset integer; the greater the integer is made, the smaller the phase deviation in a stationary state is made).

Figure 4:
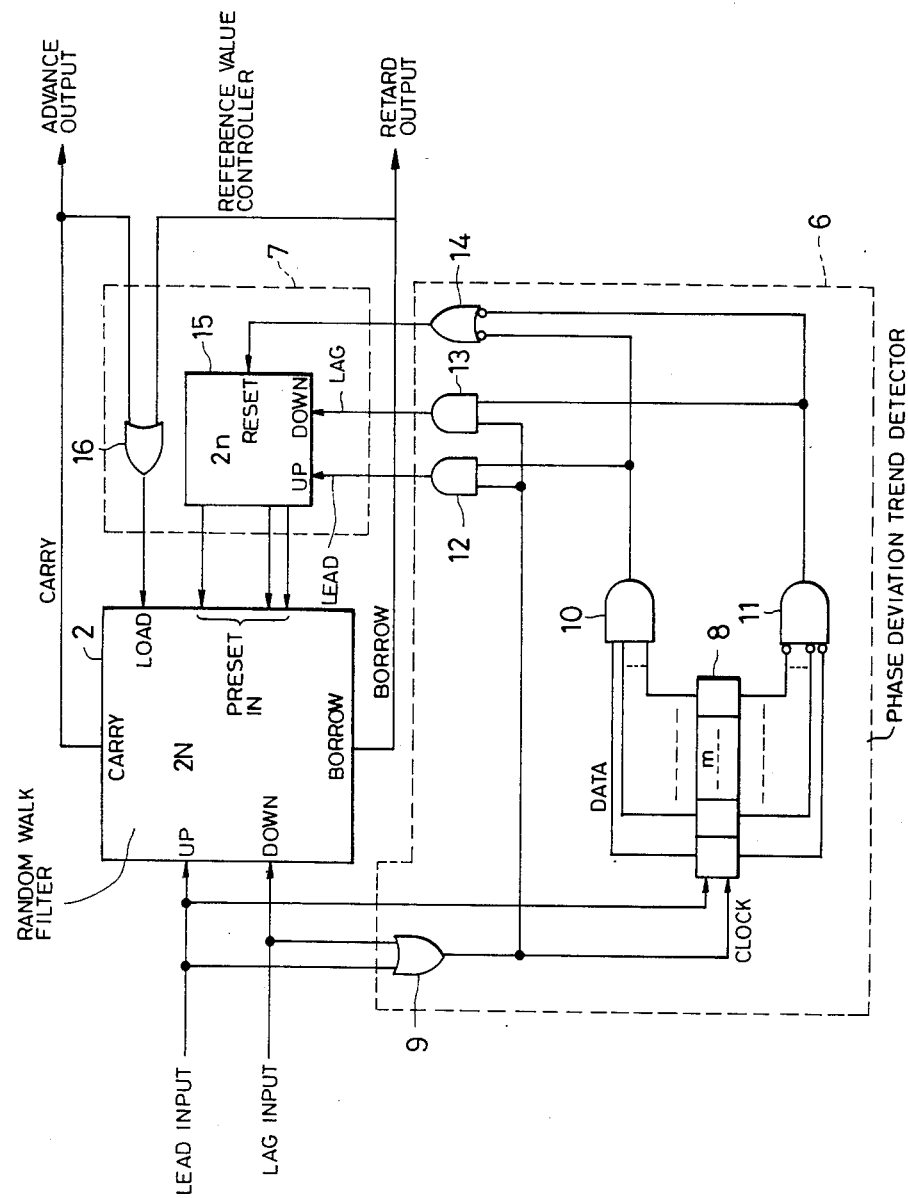
FIG. 4 shows a circuit diagram indicating the electrical design of the major part of the digital phase-locked loop.

FIG. 4 shows a detailed circuit diagram of the random walk filter 2, the phase deviation trend detector 6 and the reference value controller 7.

Figure 1:
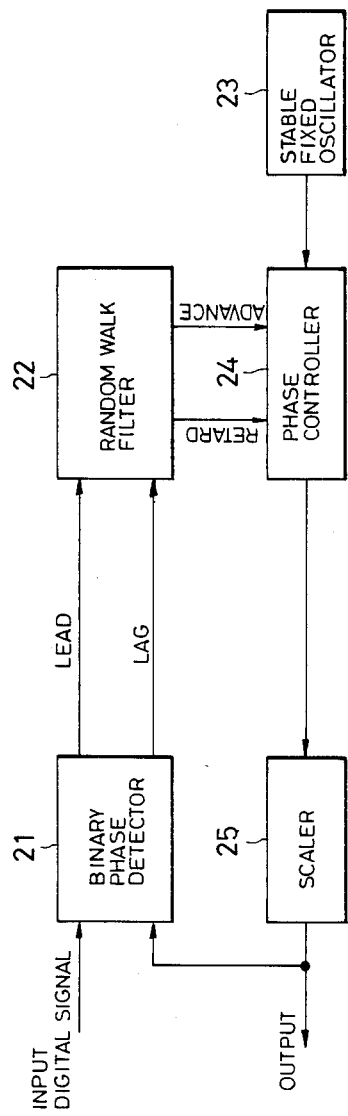
FIGS. 1 and 2 show circuit diagrams of a conventional digital phase-locked loop.
Figure 2:
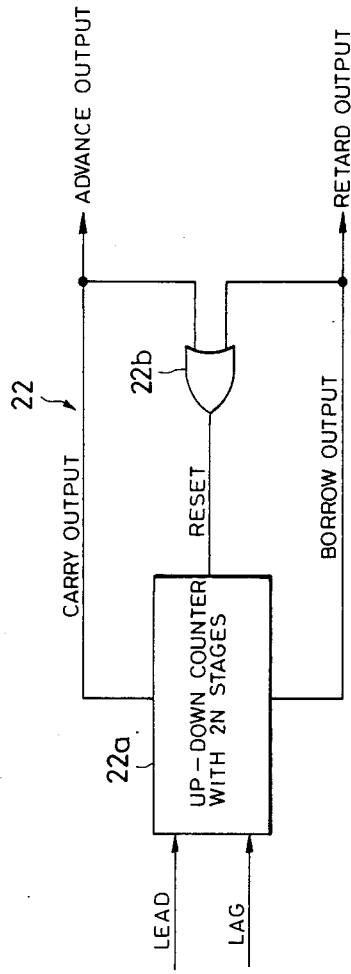

The lead signal is supplied to the up-counting input terminal of the random walk filter 2, while the lag signal is supplied to the down-counting input terminal of the filter. When a load pulse of the reference value controller 7 is supplied to the load terminal of the filter 2, a numerical value signal of the controller 7 is supplied to the presetting input terminals of the filter 2. The filter 2 sends out the carry pulses as the advance output or the borrow pulses as the retard output, similarly to the up-down counter 22a of FIG. 2.

The major part of the phase deviation trend detector 6 is a shift register 8 having m stages. The output of an OR gate 9, which receives the lead signal and the lag signal is supplied as a clock signal to the shift register 8. The lead signal is supplied as data pulses to the shift register 8. The parallel output of all the stages of the shift register 8 are supplied to a first AND gate 10 without being inverted. Additionally, the output signals of all the stages of the shift register 8 are inverted and then supplied to a second AND gate 11. The output of the first and the second AND gates 10 and 11 are supplied to AND gates 12 and 13, which are opened by the output of the OR gate 9 receiving the lead and retard input indication signals. The output of the AND gates 10 and 11 are inverted and then supplied to a NAND gate 14. The number m is determined depending on the number 2n of the stages or counting range of an up-down counter 15 described hereinafter. It is preferable to determine the number m to maximally enhance both the jitter suppression and the response of the digital phase-locked loop.

The reference value controller 7 comprises the up-down counter 15 and an OR gate 16. The output signal of the AND gate 12 is supplied as an advance reference value control signal to the up-counting input terminal of the up-down counter 15. The output signal of the AND gate 13 is supplied as a retard reference value control signal to the down-counting input terminal of the up-down counter 15. The output of the NAND gate 14 is supplied to the resetting input terminal of the up-down counter 15.

The output of the OR gate 16, which receives the advance output and the retard output, is supplied to the load terminal of the random walk filter 2. The numerical value output of the up-down counter 15 is supplied to the presetting input terminal of the random walk filter 2.

Since the operation of the digital phase-locked loop of the above-described constitution is nearly the same as that of a conventional digital phase-locked loop, only the operation of the loop part shown in FIG. 4 is hereafter described.

When the lead signal is supplied (a high-level signal is output), the contents of the shift register 8 are sequentially shifted to the right and the content of the first stages thereof is set at a high level.

When the lag signal is supplied as a high level signal, the contents of the shift register 8 are sequentially shifted to the right and the content of the first step thereof is set at a low level.

When only the lead signal is supplied m sequential and uninterrupted times, the contents of all the stages of the shift register 8 are set at a high level so that the first AND gate 10 sends out a high-level signal. The high-level signal is supplied to the up-counting input terminal of the up-down counter 15 through an AND gate 12 opened at the timing of the rising of the output signal of the OR gate 9, so that the count of the up-down counter 15 is increased by one.

When only the lag signal is supplied m sequential and uninterrupted times, the count of the up-down counter 15 is similarly decreased by one.

When neight of the lead signal or the lag signal is individually supplied m sequential times, the output signals of the AND gates 10 and 11 both remain at a low level so that theNAND gate 14 sends out a high-level signal to reset the count of the up-down counter 51 to an intermediate value n.

Since the lead signal and the lag signal are being continuously supplied to the random walk filter 2 during the above-described operation, it is filled with a content corresponding to the difference between the number of times of the supply of the lead signal and number of times for the lag signal. When the difference has reached a prescribed number, the carry pulses or the borrow pulses are sent out. The phase controlled 4 can be regulated depending on the carry pulses or the borrow pulses.

When the carry pulses or the borrow pulses are sent out, the OR gate 16 supplies the load pulses to the random walk filter 2 so that an initial value is preset by the present count of the up-down counter 15.

For these reasons, when the lead signal is supplied m sequential times, for instance, the count of the up-down counter 15 becomes n+1 so that the carry output is sent out when the number of times of the supply of the lead signal is less by one than in the conventional random walk filter. After that, the count of the up-down counter 15 is increased every time yet another lead signal is supplied to the random walk filter 2. When the carry pulses are sent out from the random walk filter 2 the next time, the increased count of the up-down counter 15 is the value which is preset into the random walk filter 2. For that reason, the carry pulses can be sent out from the random walk filter after a reduced number of times of the supply of the lead input Since the count of the up-down counter 15 is decreased when the lag signal is continuously supplied m or more times, the number of times that an input of the lag signal will be necessary to send out the borrow pulses, can be reduced.

When the lag signal is supplied to the random walk filter 2 during the continuous supply of the lead signal thereto or vice versa, the output signals of the AND gate 10 and 11 are both immediately set at a low level so that the NAND gate 14 sends out a high-level signal to reset the count of the up-down counter 15 to the intermediate value.

Since the AND gates 12 and 13 are opened at the time of the rising of the output signal of the OR gate 9, the accuracy of the operation is enhanced.

The above description is hereafter summarized. When the trend of the lead or lag of the phase is continuing, the count of the up-down counter 15 is increased or decreased and the present value of the random walk filter 2 is reset to the count of the up-down counter 15 at a prescribed timing. For that reason, the number of times of the supply of the input indication signal, which is necessary to be performed until the carry signal or the borrow signal is sent out, is reduced to quicken the response of the filter 2. When the trend of the advance or delay of the phase has stopped continuing, the count of the up-down counter 15 is reset to the intermediate value. For that reason, the jitter suppression effect of the filter 2 is enhanced.

The present invention is not confined to the above-described embodiment, but may be embodied in other various ways without departing from the spirit or essential character of the inventions. For instance, the phase deviation trend detector may be made of a microcomputer if very rapid filtering does not need to be performed.

What is claimed is:

1. A digital phase-locked loop circuit, comprising:
    means for determining a phase of an input signal relative to an output signal to selectively supply one of a lead output and a lag output;
    a random walk filter receiving said lead and lag outputs to thereby supply one of a phase advance output and a phase retard output;
    phase control means receiving said phase advance and retard outputs and a stable oscillation signal for providing a phase compensated signal being said output signal;
    phase deviation trend detection means receiving said lead and lag outputs for detecting a trend of a deviation of said phase to thereby produce a phase trend indication signal; and
    a reference value control means for altering a reference value supplied to said random walk filter responsive to said phase trend indication signal.

2. A digital phase-locked loop circuit as recited in claim 1, wherein said phase deviation trend detection means comprises:
    means for detecting at least one predetermined sequence of said lead and lag outputs.

3. A digital phase-locked loop circuit as recited in claim 2, wherein said sequence detecting means comprises:
    a clock signal synchronized with said lead and lag outputs;
    a shift register clocked by said clock signal and receiving one of said lead and lag outputs; and
    two linear logic circuits receiving a first combination and a second combination inverted from said first combination of parallel outputs of said shift register.

4. A digital phase-locked loop circuit as recited in claim 1, wherein said reference value control means comprises an up-down counter receiving count and reset signals from said phase deviation trend detection means.

5. A digital phase-locked loop circuit as recited in claim 4, wherein said reference value control means further comprises logic means responsive to said phase advance and retard outputs for presetting an initial value of said random walk filter with an output of said up-down counter.

6. A digital phase-locked loop circuit as recited in claim 2, wherein said sequence detecting means comprises:
    a clock signal synchronized with said lead and lag outputs;
    a shift register clocked by said clock signal and receiving one of said lead and lag outputs;
    two linear logic circuits receiving a first combination and a second combination inverted from said first combination of parallel outputs of said shift register;
    gating circuits controlled by said clock signal connected between said two linear logic circuits and counting inputs of said up-down counter; and
    a logic circuit connected between said two linear logic circuits and a resetting input of said up-down counter.

7. A method of synchronizing a phase locked loop, comprising the steps of:
    determining a phase of an input signal relative to an output signal;
    selecting a lead output or a lag output responsive to said determining step;
    determining occurrences of said lead output and said lag output relative to each other and to a reference value to thereby select a phase advance condition or a phase retard condition;
    providing a phase compensated signal related to said input signal responsive to said selected phase advance and retard conditions, said phase compensated signal being said output signal;
    detecting a trend of a deviation of said phase; and
    varying said reference value in response to said detected trend.

* * * * *